(12) United States Patent
Vautin et al.

(10) Patent No.: US 10,531,195 B2
(45) Date of Patent: Jan. 7, 2020

(54) MULTI-ZONE AUDIO SYSTEM WITH INTEGRATED CROSS-ZONE AND ZONE-SPECIFIC TUNING

(71) Applicant: Bose Corporation, Framingham, MA (US)

(72) Inventors: Jeffery R. Vautin, Worcester, MA (US); Michael S. Dublin, Cambridge, MA (US); Eduardo T. Salvador, Cambridge, MA (US); Charles Oswald, Salem, NY (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 15/720,622

(22) Filed: Sep. 29, 2017

(65) Prior Publication Data

US 2019/0104363 A1 Apr. 4, 2019

(51) Int. Cl.
*H04R 3/12* (2006.01)
*H04R 5/02* (2006.01)
(Continued)

(52) U.S. Cl.
CPC .............. *H04R 3/12* (2013.01); *H04R 5/02* (2013.01); *H04R 2205/024* (2013.01); *H04R 2499/13* (2013.01)

(58) Field of Classification Search
CPC ...... H04R 3/12; H04R 5/02; H04R 2205/024; H04R 2499/13
See application file for complete search history.

(56) References Cited

U.S. PATENT DOCUMENTS 7,571,014 B1 * 8/2009 Lambourne ............ H04R 27/00
700/94
9,847,081 B2 * 12/2017 Oswald ................ G10K 11/178
(Continued)

FOREIGN PATENT DOCUMENTS

EP 2 377 121 10/2016

OTHER PUBLICATIONS

International Search Report & Written Opinion; PCT/US2018/053485; dated Nov. 30, 2018; 13 pages.

*Primary Examiner* — Ping Lee
(74) *Attorney, Agent, or Firm* — Fish & Richardson P.C.

(57) ABSTRACT

The technology described in this document can be embodied in a method that includes receiving information indicative of a volume setting corresponding to each listening zone of a plurality of listening zones. The method also includes generating a zone-specific adjustment signal for each of the plurality of listening zones, wherein the zone-specific adjustment signal for a given listening zone accounts for a cross-zone effect associated with a volume setting corresponding to another listening zone, and is configured to adjust an output of corresponding zone-specific circuitry. The method further includes generating an additional adjustment signal configured to adjust an output of a cross-zone equalization filter. The output of the cross-zone equalization filter is configured to generate a target acoustic distribution across multiple listening zones. The method also includes generating an output of an acoustic transducer of the multi-zone audio system based on the zone-specific adjustment signals and the additional adjustment signal.

25 Claims, 6 Drawing Sheets

(51) Int. Cl.
    *H04S 7/00*     (2006.01)
    *H03G 5/16*     (2006.01)
    *H03G 3/30*     (2006.01)
    *H03G 3/02*     (2006.01)

(56) References Cited

U.S. PATENT DOCUMENTS

| | | | |
|---|---|---|---|
| 10,049,686 B1* | 8/2018 | Hera | G10L 21/0232 |
| 10,056,068 B2* | 8/2018 | Oswald | G10K 11/178 |
| 2008/0032663 A1* | 2/2008 | Doyle | H04H 20/106 |
| | | | 455/345 |
| 2008/0273713 A1 | 11/2008 | Hartung et al. | |
| 2010/0158263 A1* | 6/2010 | Katzer | G10K 11/175 |
| | | | 381/73.1 |
| 2014/0079243 A1* | 3/2014 | Appell | H03G 3/32 |
| | | | 381/86 |
| 2017/0053636 A1 | 2/2017 | Oswald et al. | |
| 2017/0213541 A1* | 7/2017 | MacNeille | H04R 1/1083 |

\* cited by examiner

MULTI-ZONE AUDIO SYSTEM WITH INTEGRATED CROSS-ZONE AND ZONE-SPECIFIC TUNING

TECHNICAL FIELD

This disclosure relates to audio systems (e.g., vehicular audio systems) that are capable of providing acoustically isolated listening zones.

BACKGROUND

Audio systems such as ones deployed in cabins of high-end vehicles may facilitate creation of multiple zones that are acoustically isolated, at least to some extent, from one another.

SUMMARY

In one aspect, this document features a method that includes receiving information indicative of a volume setting corresponding to each listening zone of a plurality of listening zones associated with a multi-zone audio system. The method also includes generating, by one or more processing devices, a zone-specific adjustment signal for each of the plurality of listening zones, wherein the zone-specific adjustment signal for a given listening zone accounts for a cross-zone effect associated with a volume setting corresponding to another listening zone, and is configured to adjust an output of corresponding zone-specific circuitry. The method further includes generating, by the one or more processing devices, an additional adjustment signal configured to adjust an output of a cross-zone equalization filter. The output of the cross-zone equalization filter is configured to generate a target acoustic distribution across multiple listening zones. The method also includes generating an output of an acoustic transducer of the multi-zone audio system based on the zone-specific adjustment signals and the additional adjustment signal.

In another aspect, this document features an audio system configured to deliver audio to a plurality of listening zones. The system includes multiple acoustic transducers disposed in the plurality of listening zones, and zone specific circuitry corresponding to one or more of the plurality of listening zones. The system also includes a cross-zone equalization filter configured to control one or more of the acoustic transducers to generate a target acoustic distribution across multiple listening zones, and an adjustment engine that includes one or more processing devices. The adjustment engine is configured to receive information indicative of a volume setting corresponding to each listening zone of the plurality of listening zones, and generate a zone-specific adjustment signal for each of the plurality of listening zones. The zone-specific adjustment signal for a given listening zone accounts for a cross-zone effect associated with a volume setting corresponding to another listening zone, and is configured to adjust an output of the corresponding zone-specific circuitry. The adjustment engine is further configured to generate an additional adjustment signal configured to adjust an output of the cross-zone equalization filter. The zone-specific adjustment signals and the additional adjustment signal are combined to generate an output from at least one of the multiple acoustic transducers.

In another aspect, this document features one or more machine-readable storage devices having encoded thereon computer readable instructions for causing one or more processing devices to perform various operations. The operations include receiving information indicative of a volume setting corresponding to each listening zone of a plurality of listening zones associated with a multi-zone audio system, and generating a zone-specific adjustment signal for each of the plurality of listening zones, The zone-specific adjustment signal for a given listening zone accounts for a cross-zone effect associated with a volume setting corresponding to another listening zone, and is configured to adjust an output of corresponding zone-specific circuitry. The operations further include generating an additional adjustment signal configured to adjust an output of a cross-zone equalization filter, wherein the output of the cross-zone equalization filter is configured to generate a target acoustic distribution across multiple listening zones. The operations also include causing generation of an output of an acoustic transducer of the multi-zone audio system based on the zone-specific adjustment signals and the additional adjustment signal.

Implementations of the above aspects may include one or more of the following features.

Each of the zone-specific circuitry can include a zone-specific equalization filter configured to process an input signal representing audio content for the corresponding listening zone. Each of the zone-specific circuitry can include a first zone-specific equalization filter configured to process a first input signal in a first frequency range, and at least a second zone-specific equalization filter configured to process a second input signal in a second frequency range that is at least partially non-overlapping with the first frequency range. The filter coefficients of the cross-zone equalization filter can be selected in accordance with a target acoustic distribution across the multiple listening zones. The zone-specific adjustment signals can be generated by computing a gain for each of the plurality of listening zones based on the information indicative of the corresponding volume settings. The additional adjustment signal can be generated based also on the information indicative of the corresponding volume settings. The zone-specific adjustment signals may be generated by accessing a representation of a look-up table that stores gain values for each of the plurality of listening zones as a function of combinations of volume settings in the plurality of listening zones. The look-up table can also store gain values associated with the additional adjustment signal as a function of combinations of volume settings in the plurality of listening zones. The plurality of listening zones can be located within a vehicle. Generating the output of the acoustic transducer can include generating a plurality of zone-specific signals by adjusting the outputs of zone-specific circuitry using the corresponding zone-specific adjustment signals, generating a multi-zone signal by adjusting the output of the cross-zone equalization filter using the additional adjustment signal, and combining the plurality of zone-specific signals and the multi-zone signal to drive the acoustic transducer. The information indicative of the volume setting can represent a value within a substantially continuous range. The information indicative of the volume setting can represent a particular discrete value from a set of discrete values.

Various implementations described herein may provide one or more of the following advantages. Carefully tuned cross-zone distribution of audio in accordance with a target radiation pattern can be achieved in a multi-zone audio system that also facilitates individual control of the multiple zones. By providing a unified system that controls the individual zones, as well as additional equalization circuitry for cross-zone spatial effects, a seamless integration of cross-zone and zone-specific controls may be achieved. This in turn may result in an improved audio system that produces cross-zone spatial effects, and yet retains the flexibility of providing acoustic isolation between the zones based on user-preference.

Figure 1A:
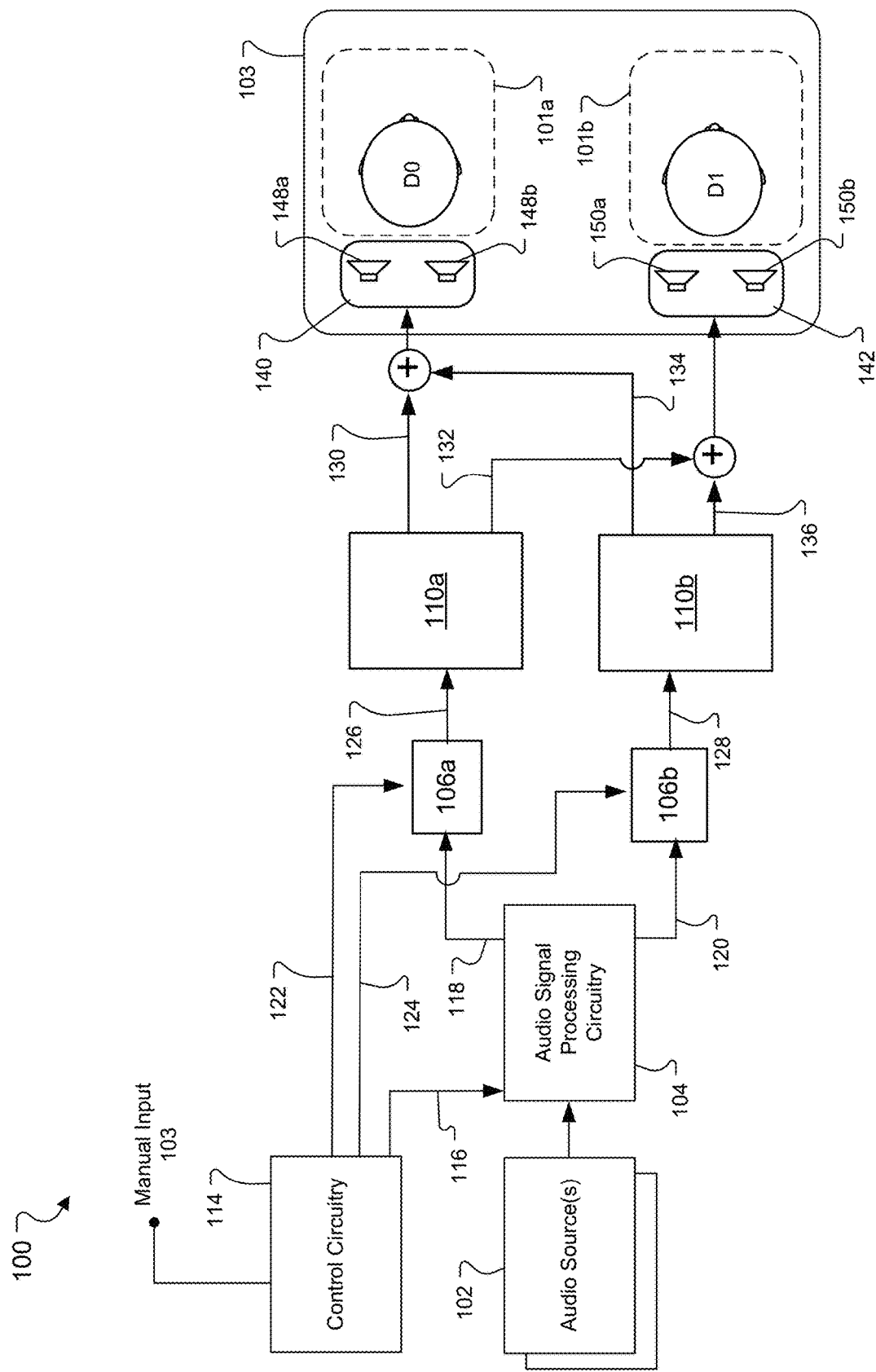
FIG. 1A is a schematic view of an example implementation of a vehicle audio system for providing isolated listening zones in a vehicle cabin.

Repeat use of reference characters in the present specification and drawings is intended to represent same or analogous features or elements.

DETAILED DESCRIPTION

This document describes technology that may allow seamless integration of zone-specific and cross-zone controls in multi-zone audio systems such as ones found, for example, in high-end automobiles. Multi-zone audio systems allow for implementation of listening zones that are acoustically isolated, at least to some extent, with respect to one another. Such acoustic isolation between the zones may allow users in different zones to adjust the audio outputs in the corresponding zones (gain, equalization etc.) independently of the settings in the other volume zones. Examples of such multi-zone audio systems are described in U.S. patent application Ser. No. 14/828,991, filed on Aug. 18, 2015, the entire content of which is incorporated herein by reference.

Acoustic isolation between different zones can allow for controlling the audio output in the different zones separately. However, in some cases, cross-zone control of transducers that deliver acoustic energy to multiple zones may be desirable. For example, audio output from speakers that deliver sound to multiple zones may be used to produce improved spatial audio effects (e.g., surround sound) in the vehicle cabin. In addition, because audio output in one zone may leak into another zone, change in user-settings in one zone may prompt associated adjustments in other zones. For example, if a user in a first zone increases the volume, a portion of the increased audio output from the transducers in the first zone may leak into a second zone. Therefore, the audio output from the acoustic transducers in the second zone may need to be adjusted such that a user in the second zone is not substantially affected by the changes made in the first zone.

Cross-zone control may be achieved, for example, using one or more cross-zone equalization filters configured to balance audio output across multiple zones. The one or more cross-zone equalization filters may control the speakers in individual zones, or control a set of speakers disposed to deliver sound substantially equally to multiple zones. In some cases though, the audio output requested by a cross-zone equalization filter may conflict with the zone-specific user-defined settings for the corresponding zone. For example, an equalization filter may request a particular transducer in a given zone to output audio at a particular gain level to achieve a target audio distribution in the cabin. However, a user in the corresponding zone may be requesting a gain level that is different from that requested by the equalization filter. In such cases, one or more parameters (e.g., gain) associated with the outputs from the transducers in the different zones may have to be recomputed to prioritize the user-preference over any cross-zone distribution of output audio.

The technology described herein allows for computation of one or more output parameters (e.g., gain) of acoustic transducers to allow seamless integration of zone-specific and cross-zone audio distribution. In some implementations, for each transducer or zone, (N+1) adjustment signals can be computed based on N different inputs. N≥2 represents the number of zones, and the N different inputs each represents the settings (e.g. volume/gain level) corresponding to a given zone. One of the (N+1) adjustment signals can then be used to adjust the output of a cross-zone equalization filter, and each of the remaining N adjustment signals can be used to adjust zone-specific circuitry corresponding to the different zones. Therefore, by simultaneously controlling the zone specific circuitry and the cross-zone equalization filter, the technology described herein allows for substantially seamless integration of cross-zone and zone-specific audio distributions. This in turn may improve the flexibility of corresponding vehicular audio systems by allowing the same system to achieve both acoustic isolation and cross-zone audio in accordance with a target spatial distribution based on user-preferences.

FIG. 1A is a schematic view of an example implementation of a vehicle audio system for providing isolated listening zones in a vehicle cabin. In some implementations, cross-talk cancellation can be utilized in combination with near-field speakers to provide discrete listening zones at different seating positions within a listening area, such as a vehicle cabin. As used herein "near-field speakers" is intended to mean speakers located near a listener's head. In some implementation, the system 100 shown in FIG. 1 incorporates a number of cross-talk cancellation filters in combination with a plurality of headrest-mounted speakers to provide two discrete listening zones 101a, 101b. The two zones are shown for illustrative purposes, and in some implementations, three or more zones can be provided without deviating from the scope of this disclosure. The system 100 includes one or more audio sources 102, which are coupled to audio signal processing circuitry 104. The audio signal processing circuitry 104 is coupled to zone-specific gain adjustment circuitry 106a, 106b, respectively. In some implementations, the zone-specific gain adjustment circuitry 106a, 106b is coupled to the headrest mounted speakers via cross-talk cancellation filter blocks 110a-d.

In some implementations, in response to control information received from a user through manual input 103, a control circuit 114 sends one or more signals 116 to the audio signal processing circuitry 104 for selecting an audio source for the listening zones 101a, 101b. In some implementations, the signal 116 may identify which audio source is selected for each of the listening zones. Each listening zone can select a different audio source, or a common audio source may be selected for both listening zones 101a, 101b. For example, if the user in one zone wants to take a phone call while music from a common audio source is playing in both zones, the call audio may be routed to the corresponding zone without changing the audio source for the user in the other zone.

In some implementations, the audio signal processing circuitry 104 delivers a first audio signal 118 representing audio content for the zone 101a to the gain adjustment circuitry 106a, and delivers a second audio signal 120 representing audio content for the zone 101b to the gain adjustment circuitry 106b. The gain adjustment circuitries 106a and 106b (106, in general) can be controlled based on, for example, volume control information received from users through the one or more manual inputs 103. For example, in response to the one or more manual inputs 103, the control circuitry 114 may send first and second volume control signals 122 and 124 to the gain adjustment circuitry 106a and 106b, respectively. The gain adjustment circuitry 106a, 106b can be configured to adjust the respective amplitudes of the first and second audio signals 118, 120 in response to the volume control signals 122, 124 and generate amplitude adjusted audio signals 126, 128. In some implementations, the amplitude adjusted audio signals 126, 128 can be provided to the cross-talk cancellation filter blocks 110a and 110b, respectively. The cross-talk cancellation blocks can be configured to provide acoustic isolation between the different zones, and in some implementations, the number of cross-talk cancellation blocks can be equal to the number of zones. In the example of FIG. 1, the gain adjustment circuitry 106a controls volume of audio content presented in the listening zone 101a, and the gain adjustment circuitry 106b operates to control the volume of audio content presented in the listening zone 101b. Consequently, even when the same audio content is selected for presentation in both zones, the volume level may still differ between the zones based on user inputs for the corresponding zones.

In some implementations, when the volume difference between zones becomes large (>~6 dB), there may be some spectral coloring in the attenuated zone (i.e., the lower volume zone) because of the relatively poorer isolation at higher frequencies. This may be noticeable, for example, when the same audio contented is presented in both listening zones. In some cases, to inhibit such spectral coloring, lower frequencies may be attenuated less than higher frequencies in the attenuated zone, which can help to flatten the acoustic energy in the attenuated zone (i.e., to maintain a substantially balanced spectrum) to provide a user experience that feels more like regular volume control.

In some implementations, the gain adjustment circuitry 106 can include one or more volume-based equalizer circuitry that provides volume-based equalization to account for band-dependent isolation. For example, in response to volume control information received from a user through manual input 103, the control circuitry 114 can be configured to include within the volume control signal 122, an indication of the respective volume settings for both zones. Similarly, the volume control signal 124 may include an indication of the respective volume settings for both zones. The corresponding gain adjustment circuitries 106 can be configured to then use this information to dynamically adjust equalization to inhibit spectral coloring, for example, when the relative volumes of the zones exceeds a predetermined threshold.

Figure 1B:
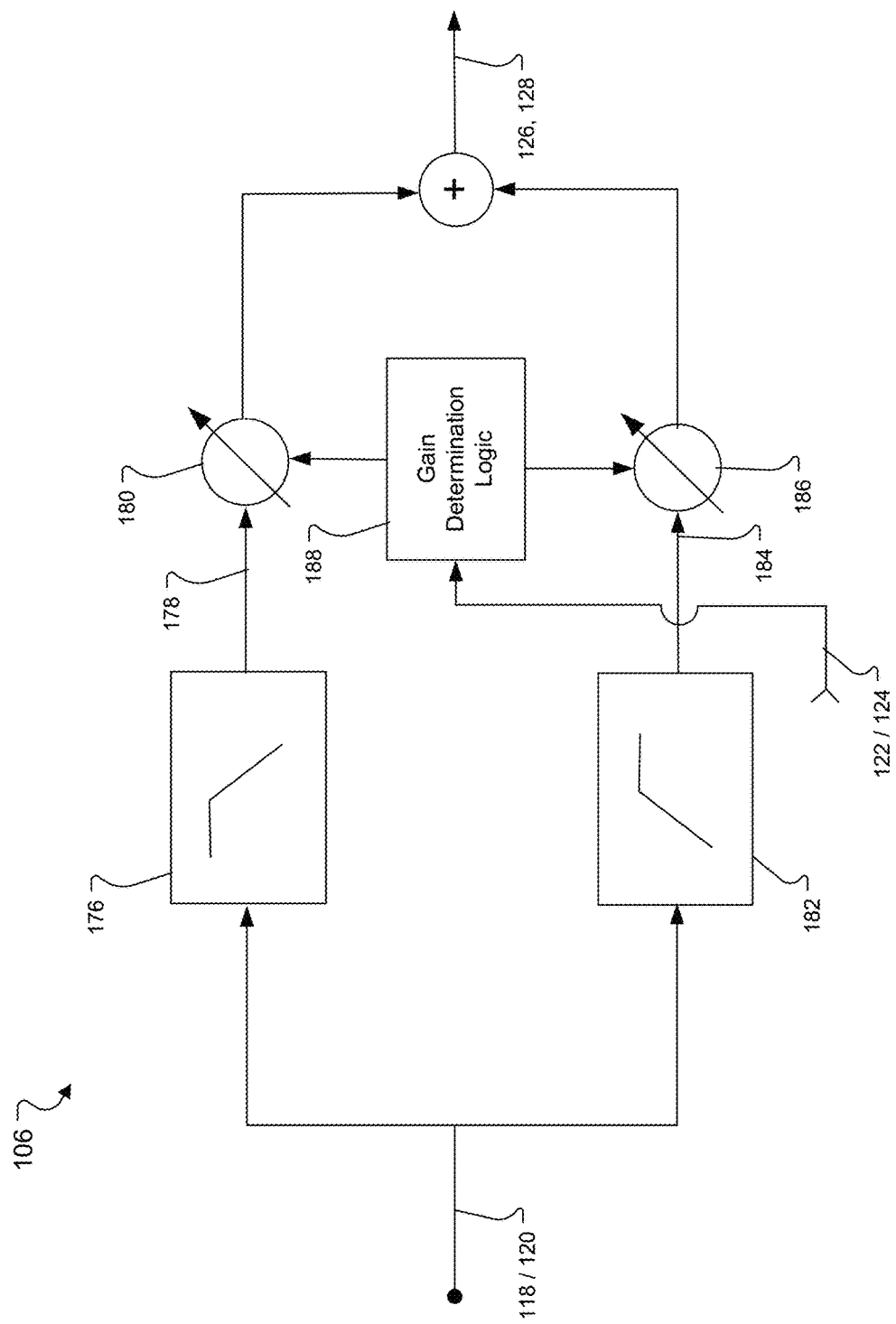
FIG. 1B is a schematic view of volume-based equalization circuitry from the vehicle audio system of FIG. 1A.

Referring to FIG. 1B, the gain adjustment circuit 106 can include equalization circuitry having a low pass filter 176, which filters high frequency content out of the audio signal 118, 120 and passes a low frequency signal 178 including the low frequency content to a low frequency dynamic gain adjustment circuit 180. The equalization circuitry can also include a high pass filter 182 that filters low frequency content out of the audio signal 118, 120 and passes a high frequency signal 184 including the high frequency content to a high frequency dynamic gain adjustment circuit 316.

The gain adjustment circuit 106 can also include a gain determination logic circuit 188 that may be configured to receive the volume control signal 122 or 124 from the control circuitry 114, and control the low and/or high frequency dynamic gain adjustment circuits 180 or 186, respectively, accordingly. For example, the gain determination logic circuit 188 may determine the difference in the volume settings between a given zone (e.g., 101a) and another zone (e.g., 101b), and control the respective gains/attenuation applied by the low and high frequency dynamic gain adjustment circuits 180 and 186 based on the determined difference. In some implementations, the gain determination logic circuit 188 may adjust the low frequency dynamic gain 180 to limit the attenuation of the low frequencies, for example, when the determined volume differential exceeds a first predetermined level (e.g., 6 dB).

Referring back to the example of FIG. 1A, the gain adjustment circuitry 106a provides a first amplitude adjusted audio signal 126 to the cross-talk cancellation filter blocks 110a, and the gain adjustment circuitry 106b provides a second amplitude adjusted audio signal 128 to the cross-talk cancellation filter block 110b. In some implementations, a gain adjustment circuitry 106 may provide an amplitude adjusted audio signal to multiple cross-talk cancellation filter blocks 110.

In some implementations, each of the filter blocks 110a and 110b includes a plurality of cross-talk cancellation filters, which may be implemented as least-squares (LS) filters. The input to the cross-talk cancellation filters are the amplitude adjusted audio signals 126 and the amplitude adjustments can be determined as:

$$G = I^{-1} \times D \qquad (1)$$

where, G is a vector representing the amplitude adjustments; I is a matrix representing the measured acoustic transfer functions (which may be referred to as an isolation matrix), and $I^{-1}$ is the pseudo inversion of that matrix; and D is a vector representing the target amplitudes (which may be represented in terms of desired gain values) at the vehicle occupant's heads.

Equation (1) may be rewritten as:

$$\begin{bmatrix} I_{00} & \cdots & I_{0N} \\ \vdots & \ddots & \vdots \\ I_{N0} & \cdots & I_{NN} \end{bmatrix} \begin{bmatrix} G_0 \\ \vdots \\ G_N \end{bmatrix} = \begin{bmatrix} D_0 \\ \vdots \\ D_N \end{bmatrix} \qquad (2)$$

Where $I_{jk}$ represents the attenuation of sound presented in seat k as measured in seat j, $D_n$ is the desired gain in seat n, and $G_n$ is the actual gain required in seat n to produce the desired results. An example of the isolation matrix for a two-zone system can be as follows:

$$\begin{aligned} I &= \begin{bmatrix} 1.000 & 0.089 \\ 0.100 & 1.000 \end{bmatrix} \\ &= \begin{bmatrix} 0 & -21 \text{ dB} \\ -20 \text{ dB} & 0 \end{bmatrix} \end{aligned} \qquad (3)$$

wherein the isolation matrix is generated from measured dB attenuation values. In this example, the isolation matrix is not symmetric—with zone 1 projecting less sound into zone 0 (−21 dB) as compared to what zone 0 projects into zone 1 (−20 dB)—and represents a general case. In some implementations, the isolation matrix may be symmetric.

In some implementations, the actual gain values required to reach the desired gains in all seats can be calculated using equation (1) as:

$$\begin{bmatrix} I_{00} & \cdots & I_{0N} \\ \vdots & \ddots & \vdots \\ I_{N0} & \cdots & I_{NN} \end{bmatrix}^{-1} \begin{bmatrix} D_0 \\ \vdots \\ D_N \end{bmatrix} = \begin{bmatrix} G_0 \\ \vdots \\ G_N \end{bmatrix} \quad (4)$$

For a two zone case, with desired gains of 0.5 in each, the actual gain values G may be calculated as:

$$\begin{bmatrix} G_0 \\ G_1 \end{bmatrix} = \begin{bmatrix} 1.000 & 0.089 \\ 0.100 & 1.000 \end{bmatrix}^{-1} \begin{bmatrix} 0.5 \\ 0.5 \end{bmatrix} = \begin{bmatrix} 0.460 \\ 0.454 \end{bmatrix} \quad (5)$$

In some implementations, the computed actual gain values may be unattainable. For example, consider the following desired gain matrix (which represents a system capable of infinite isolation):

$$\begin{bmatrix} D_0 \\ D_1 \end{bmatrix} = \begin{bmatrix} 1.0 \\ 0.0 \end{bmatrix} \quad (6)$$

The corresponding actual gains G is given by:

$$\begin{bmatrix} G_0 \\ G_1 \end{bmatrix} = \begin{bmatrix} 1.000 & 0.089 \\ 0.100 & 1.000 \end{bmatrix}^{-1} \begin{bmatrix} 1.0 \\ 0.0 \end{bmatrix} = \begin{bmatrix} 1.009 \\ -0.101 \end{bmatrix} \quad (10)$$

The negative actual gain values indicate that out of phase signals would be required in the zones to achieve the desired gains. However because the signals in the zones may not be perfectly coherent, the desired gains may be unattainable in practice.

In some implementations, in order to mitigate any undesired effects of the above situation, the actual gains may be constrained to be greater than or equal to zero. In some implementations, the actual gain may also be constrained to be less than or substantially equal to the specified desired gain. This is represented as:

$$\begin{bmatrix} G_0 \\ \vdots \\ G_N \end{bmatrix} = \min\left(\max\left(\begin{bmatrix} I_{00} & \cdots & I_{0N} \\ \vdots & \ddots & \vdots \\ I_{N0} & \cdots & I_{NN} \end{bmatrix}^{-1} \begin{bmatrix} D_0 \\ \vdots \\ D_N \end{bmatrix}, \begin{bmatrix} 0 \\ \vdots \\ 0 \end{bmatrix}\right), \begin{bmatrix} D_0 \\ \vdots \\ D_N \end{bmatrix}\right) \quad (11)$$

In this example, the non-linear modifications to the actual gains results in perceived gains of:

$$\begin{bmatrix} I_{00} & \cdots & I_{0N} \\ \vdots & \ddots & \vdots \\ I_{N0} & \cdots & I_{NN} \end{bmatrix} \begin{bmatrix} G_0 \\ \vdots \\ G_N \end{bmatrix} = \begin{bmatrix} 1.000 & 0.089 \\ 0.100 & 1.000 \end{bmatrix} \begin{bmatrix} 1.0 \\ 0.0 \end{bmatrix} = \begin{bmatrix} 1.0 \\ 0.0 \end{bmatrix} \quad (12)$$

which may represent the best experience attainable given the actual isolation available in the vehicle. The gain or volume determination process described above may be referred to as an "ideally-constrained" solution.

In some implementations, to avoid a situation where a given zone's actual gain is set to 0 by changes in the desired gains of other zones, one or more additional non-linearity may be added. For example, the actual gain for every zone may be constrained to be no less than a portion of the desired gain. For the example above, constraining the minimum actual gain to be at least 0.1 times of the desired gain, the actual gain may be computed as:

$$\begin{bmatrix} G_0 \\ \vdots \\ G_N \end{bmatrix} = \min\left(\max\left(\begin{bmatrix} I_{00} & \cdots & I_{0N} \\ \vdots & \ddots & \vdots \\ I_{N0} & \cdots & I_{NN} \end{bmatrix}^{-1} \begin{bmatrix} D_0 \\ \vdots \\ D_N \end{bmatrix}, 0.1 \times \begin{bmatrix} D_0 \\ \vdots \\ D_N \end{bmatrix}\right), \begin{bmatrix} D_0 \\ \vdots \\ D_N \end{bmatrix}\right) \quad (13)$$

In some implementations, the effects of clipping the calculated gains may be non-deterministic, which in turn may introduce unexpected behaviors in some cases. To address this, in some implementations, the smallest actual gain value below the pre-set bounds may be identified and clipped. The size of the matrix can then be reduced accordingly and additional iterations may be performed. In this specific example, $G_1 = -0.101$ is identified as the most negative gain, that value may then be clipped to 20 dB less than the corresponding desired gain $D_1$, $0.1*D_1 = 0.1*0.0 = 0.0$. The dimensions of the gain matrix for four zones can then be reduced as follows:

$$\begin{bmatrix} I_{00} \\ I_{10} \end{bmatrix}[G_0] = \begin{bmatrix} D_0 \\ D_1 \end{bmatrix} - G_1\begin{bmatrix} I_{01} \\ I_{11} \end{bmatrix} = \begin{bmatrix} D_0 \\ D_1 \end{bmatrix} - 0.1 \times D_1\begin{bmatrix} I_{01} \\ I_{11} \end{bmatrix} \quad (14)$$

such that:

$$\begin{bmatrix} I_{00} \\ I_{10} \end{bmatrix}^{-1}\left(\begin{bmatrix} D_0 \\ D_1 \end{bmatrix} - 0.1 \times \begin{bmatrix} I_{01} \\ I_{11} \end{bmatrix}D_1\right) = [G_0] \quad (15)$$

Solving for $G_0$ yields:

$$\begin{bmatrix} 1.0 \\ 0.1 \end{bmatrix}^{-1}\left(\begin{bmatrix} 1.0 \\ 0.0 \end{bmatrix} - 0.1 \times 0.0\begin{bmatrix} 0.089 \\ 1.000 \end{bmatrix}\right) = [0.990]$$

Reassembling the actual gain vector, and re-computing the initial equation provides actual delivered gains of:

$$\begin{bmatrix} I_{00} & \cdots & I_{0N} \\ \vdots & \ddots & \vdots \\ I_{N0} & \cdots & I_{NN} \end{bmatrix}\begin{bmatrix} G_0 \\ \vdots \\ G_N \end{bmatrix} = \begin{bmatrix} 1.000 & 0.089 \\ 0.100 & 1.000 \end{bmatrix}\begin{bmatrix} 0.990 \\ 0.000 \end{bmatrix} = \begin{bmatrix} 0.990 \\ 0.099 \end{bmatrix} \quad (16)$$

In some implementations, identifying and clipping the lowest gain value may minimize the error between the desired and perceived gains in a least-squares sense. This in turn may remove gain-adjustment discontinuities that may otherwise occur as a function of the manual input 103. In some cases, this may improve the overall user-experience by avoiding large changes in the computed gains for small changes to the manual inputs. In some implementations, where signals from different audio sources are routed to different zones, the isolation matrix may be modified accordingly. For example, if a phone call is routed to zone 0 while music plays in zone 1, the isolation matrix may be modified to reflect perfect isolation between the zones as:

$$I = \begin{bmatrix} 1.0 & 0.0 \\ 0.0 & 1.0 \end{bmatrix} \text{ or, in dB: } \begin{bmatrix} 0 & -inf \\ -inf & 0 \end{bmatrix} \quad (17)$$

For the example illustrated in FIG. 1A, the filter transfer functions for the cross-talk cancellation filters in the cross-talk cancellation filter block 110a may be computed to reduce the effects of audio from zone 101b leaking into zone 101a. Similarly, the filter transfer functions for the cross-talk cancellation filter block 110b may be computed to reduce the effects of audio from zone 101a leaking into the zone 101b. The cross-talk cancellation filter blocks 110a can be configured to generate filtered audio signals 130, and 132 for driving the speaker set 148 (which in this example, includes acoustic transducers 148a and 148b) and the speaker set 150 (which in this example, includes acoustic transducers 150a and 150b), respectively. In some implementations, each acoustic transducer may be driven based on output signals from multiple cross-talk cancellation filter blocks 110.

Figure 1C:
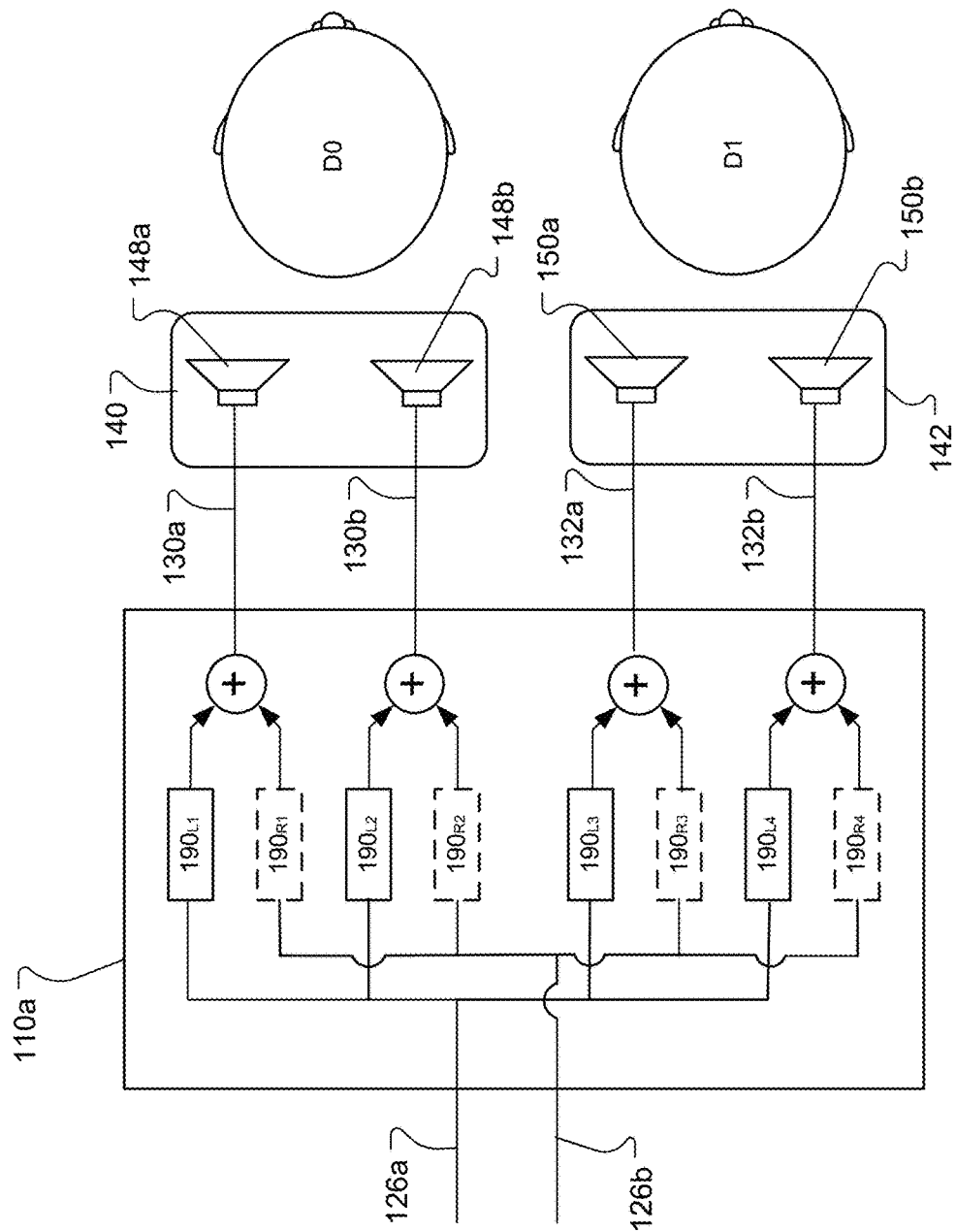
FIG. 1C is a schematic view of example cross-talk cancellation filter blocks and associated speakers from the vehicle audio system of FIG. 1.

Referring to FIG. 1C, the cross-talk cancellation filter block 110a includes a plurality of cross-talk cancellation filters (eight, in this example). The cross-talk cancellation filter 110b would be substantially similar to that shown in FIG. 1C, and is not described separately for the sake of brevity. In this example, the first amplitude adjusted audio signal 126, shown as a stereo audio signal consisting of left and right audio channels 126a and 126b, respectively, is passed through the first cross-talk cancellation filter block 110a to produce first filtered audio signals 130a, 130b, 132a, 132b, one for each of the headrest mounted speakers 148a, 148b, 150a, and 150b, respectively. These filtered audio signals determine the net acoustic energy associated with each acoustic channel in the first audio signal 118 that is provided to the occupants D0, D1 in the seats.

In some implementations, a left channel filter $190u$ associated with a left speaker 148a of the driver's headrest 140 modifies the left channel input signal 126a taking into account the acoustic transfer functions from each of the other headrest mounted speakers 148b, 150a, 150b to an expected position of the driver's left ear to produce a first output signal component that is configured to reproduce the left channel acoustic content of the first audio signal 118 at the driver's left ear.

In some implementations, a right channel filter $190_{R1}$ associated with the left speaker 148a of the driver's headrest 140 modifies the right channel input 126b from the first amplitude adjusted audio signal 126 taking into account the acoustic transfer functions from each of the other headrest mounted speakers 148b, 150a, 150b to the expected position of the driver's left ear to produce a second output signal component that is configured to substantially reduce the effect of right channel acoustic content of the first audio signal 118 that is leaked to the driver's left ear from the other speakers 148b, 150a, and 150b in the headrests 140 and 142.

In some implementations, the first and second output signal components are combined to produce a filtered audio signal 130a, which is provided to the left speaker 148a in the driver's headrest 140. The remaining cross-talk cancellation filters of the first cross-talk cancellation filter block 110a and the associated speakers 148b, 150a, 150b operate similarly so that the occupant in the driver's seat hears primarily the left audio content of the first audio signal 118 at his/her left ear and hears primarily the right audio content of the first audio signal 118 at his/her right ear.

In some implementations, filters 1902L and 19082 provide a filtered audio signal 130b to the right speaker 148b in the driver's headrest 140, which is transduced to reproduce the right channel acoustic content of the first audio signal 118 at the driver's right ear, while substantially reducing the effect of left channel content of the first audio signal 118 leaked by the other headrest mounted speakers 148a, 150a, and 150b at the driver's right ear.

In some implementations, filters $190_{L3}$ and $190_{R3}$ provide a filtered audio signal 132a to the left speaker 150a in the passenger's headrest 142, which is transduced to substantially reduce the effects of the left and right channel content of the first audio signal 118 leaked by the other headrest mounted speakers 148a, 148b, and 150b at the passenger's left ear. In some implementations, filters $190_{L4}$ and $190_{R4}$ provide a filtered audio signal 132b to the right speaker 150b in the passenger's headrest 142, which is transduced to substantially reduce the effects of the left and right channel content of the first audio signal 118 leaked by the other headrest mounted speakers 148a, 148b, and 150a at the passenger's right ear.

In some implementations, the above-described audio system can allow users in a given zone to listen to different audio content than users in other zones. In some implementations, the system can also allow user's in different zones to listen to the same audio content at contrasting volumes level. For example, a passenger in zone 101b may listen to the same audio content as the driver in zone 101a, but at a lower volume level.

In some implementations, high quality audio systems may include one or more cross-zone equalization filters that are configured to balance audio outputs across multiple zones to produce an improved spatial presentation of audio inside the vehicle cabin. For example, when the different zones are requesting comparable volumes, the one or more cross-zone equalization filters may be used to distribute the audio output across the multiple zones to provide spatial acoustic effects such as surround sound In some implementations, the surround sound effect may be used to deliver audio from the front of an occupant as well as from far-field speakers (e.g., acoustic transducers in a different zone), possibly in conjunction with the audio delivered from the near-field speakers. In some implementations, an additional set of speakers that contribute to all zones (without adding an additional observation point with a desired gain) can be used to produce the spatial effects in the vehicle cabin. For example, a set of speakers may be disposed around the periphery of the vehicle to contribute approximately equal acoustic energy to the different zones.

Figure 2:
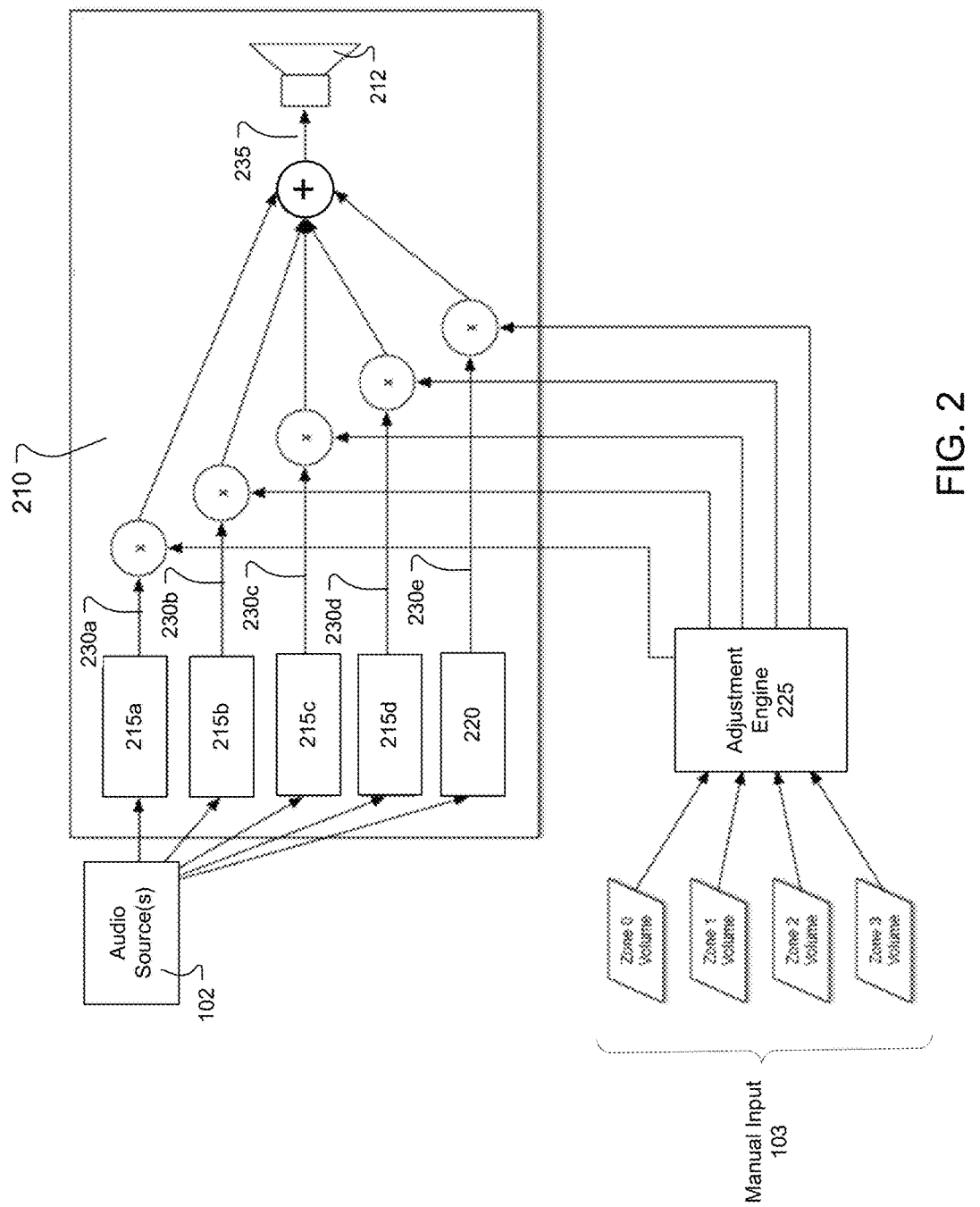
FIG. 2 is a schematic view of an example implementation of a portion of a vehicle audio system that provides integrated cross-zone and zone-specific control over audio in a multi-zone audio system.

FIG. 2 is a schematic view of an example implementation of a portion of a vehicle audio system that provides integrated cross-zone and zone-specific control over audio in a multi-zone audio system. Specifically, FIG. 2 shows circuitry 210 associated with one acoustic transducer 212 in a given zone of a four-zone audio system. Other speakers in the given zone, as well as other zones, may have circuitry substantially analogous to the circuitry 210 illustrated in FIG. 2. The circuitry 210 includes four zone-specific circuitry (e.g., equalization filters) 215a-215d (215, in general) corresponding to each of four zones. The circuitry 210 also includes a cross-zone equalization filter 220 configured to balance audio output across the multiple zones. Each of the zone specific circuitry 215 and the cross-zone equalization filter 220 processes signal received from one or more audio sources 102 and generates outputs 230a-230d and 230e (230 in general), respectively. The outputs 230 of the zone specific circuitry 215 and the cross-zone equalization filter 220 are combined to generate an output signal 235 that drives the acoustic transducer 212.

The circuitry 210 can be configured to receive multiple inputs from an adjustment engine 225, and use such inputs to adjust the outputs 230 of the zone specific circuitry 215 and the cross-zone equalization filter 220. In some implementations, the inputs from the adjustment engine 225 may be used to adjust the gains associated with respective outputs 230 of the zone specific circuitry 215 and the cross-zone equalization filter 220. The gain-adjusted signals may then be combined to generate the output signal 235 for driving the acoustic transducer 212.

In some implementations, the adjustment engine 225 may be provided as a portion of the control circuitry 114 shown in FIG. 1. The adjustment engine 225 can be configured to receive indications of volume settings for the multiple zones (e.g., as indicated by manual input 103), and generate multiple adjustment signals for adjusting the outputs 230 of the zone-specific circuitry 215 and the cross-zone equalization filter 220. For example, when the different zones are requesting substantially similar volumes, the adjustment engine 225 can be configured to generate adjustment signals that cause the output 230e of the cross-zone equalization filter 220 to dominate the output signal 235. On the other hand, if one of the zones is requesting a volume level that is substantially different from another zone, the cross-zone equalization may not be effective, and in such cases, the adjustment engine 225 can be configured to generate adjustment signals that cause the outputs 230a-230d of the zone-specific circuitries 215 to dominate the output signal 235, and the output 230e of the cross-zone equalization filter 220 to be substantially attenuated. In some implementations, the adjustment engine 225 therefore allows a seamless integration between zone-specific circuitries 215 and one or more cross-zone equalization filters 220 within the same audio system, thereby improving the range of functionalities of such a system, and potentially improving the user-experience associated with the system.

The example of FIG. 2 shows four zone-specific circuitries 215 for four different zones, and one cross-zone equalization filter 220. Accordingly, the adjustment engine 225 in this example receives four inputs (volume settings corresponding to the four zones) and generates five different adjustment signals. Four of these adjustment signals are configured to adjust the outputs 230a-230d of the zone-specific circuitries 215, and one additional adjustment signal is configured to adjust the output 230e of the cross-zone equalization filter 220. In general, the adjustment engine can be configured to receive N inputs (N≥2), and generate adjustment signals for N zones together with one or more additional adjustment signals for corresponding cross-zone equalization filters.

The one or more cross-zone equalization filters can be represented using M independent channels with N desired gains (M>N), such that equation (4) may be rewritten as:

$$\begin{bmatrix} I_{00} & \cdots & I_{0M} \\ \vdots & \ddots & \vdots \\ I_{N0} & \cdots & I_{NM} \end{bmatrix}^{-1} \begin{bmatrix} G_0 \\ \vdots \\ G_M \end{bmatrix} = \begin{bmatrix} D_0 \\ \vdots \\ D_N \end{bmatrix} \quad (18)$$

In some implementations, M=N+1 represents one set of speakers per zone, and one set of speakers that contribute substantially equally to all listening zones. If a property of the latter speaker set (such as efficiency, or bandwidth) is desired to be substantially maximized for various gain combinations, equation (18) may be solved to maximize the value of $G_M$. One property of this desired solution, if it exists, is that exactly one of the values of $G_1$ through $G_N$ will be zero. To test for the existence of a solution, the under-constrained case can be reduced to the ideally constrained case by setting $G_M$=0. If a solution exists with all non-negative values for the remaining elements of G, then a solution exists with a positive value of $G_M$. If any of the remaining elements of G is negative, they may be bounded as described in the ideally constrained case, and $G_M$ should be kept at zero.

In some implementations, if a solution exists, it may be found by iteratively setting one value of $G_0, \ldots, G_N$=0 and reducing the matrix to an ideally constrained case. The first solution found with all non-negative values may be designated as the ideal solution. In this process, at most N equations are solved to identify the solution. Setting $G_0$=0, the solution is reduced to:

$$\begin{bmatrix} I_{01} & \cdots & I_{0M} \\ \vdots & \ddots & \vdots \\ I_{N1} & \cdots & I_{NM} \end{bmatrix}^{-1} \begin{bmatrix} D_0 \\ \vdots \\ D_N \end{bmatrix} = \begin{bmatrix} G_1 \\ \vdots \\ G_M \end{bmatrix} \quad (19)$$

In some implementations, if all elements of G are non-negative, the corresponding solution may be accepted and the iterations terminated. Otherwise, the next iteration may set $G_1$=0, and the solution can be of the form:

$$\begin{bmatrix} I_{00} & I_{02} & \cdots & I_{0M} \\ \vdots & \vdots & \ddots & \vdots \\ I_{N0} & I_{N2} & \cdots & I_{NM} \end{bmatrix}^{-1} \begin{bmatrix} D_0 \\ \vdots \\ D_N \end{bmatrix} = \begin{bmatrix} G_0 \\ G_2 \\ \vdots \\ G_M \end{bmatrix} \quad (20)$$

As an example, consider the following isolation matrix and desired gain set:

$$\begin{bmatrix} 1.000 & 0.089 & 1.000 \\ 0.100 & 1.000 & 1.000 \end{bmatrix} \begin{bmatrix} G_0 \\ G_1 \\ G_2 \end{bmatrix} = \begin{bmatrix} 1.1 \\ 1.0 \end{bmatrix} \quad (21)$$

Setting $G_1$=0 produces a non-negative solution that maximizes the value of $G_2$:

$$\begin{bmatrix} G_0 \\ G_1 \\ G_2 \end{bmatrix} = \begin{bmatrix} 0.111 \\ 0.000 \\ 0.989 \end{bmatrix} \quad (22)$$

Typically, when the desired volumes for the different zones are close to one another, the gain value corresponding to $G_2$ would dominate, and in such cases, the gain adjustment signals for the zone-specific circuitry may be set to zero or near-zero values. On the other hand, when the desired gain or volume in the different zones are substantially different from one another, the gain value corresponding to $G_2$ is attenuated and the outputs of the zone-specific circuitry is allowed to dominate.

In some cases, the N signals that are combined together may not be perfectly coherent. Because of this, instead of a linear sum, the total signal level in each zone may be computed by summing the squares (or another power between one and two) of the signals in each zone as:

$$(I_{00}G_0)^2 + \ldots + (I_{0N}G_N)^2 = D_0^2 \qquad (23)$$

Figure 3A:
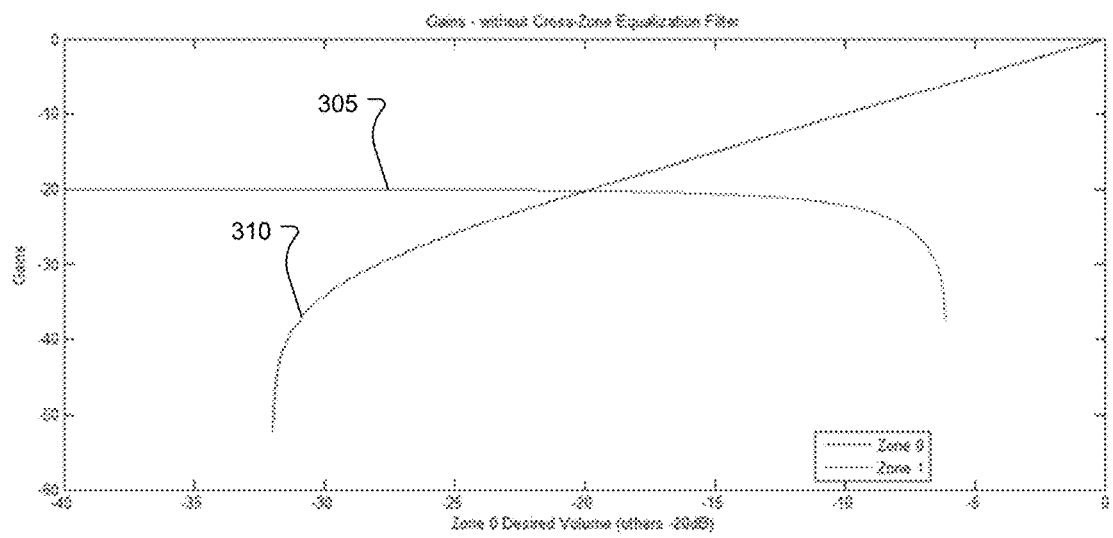
FIGS. 3A and 3B are plots that show examples of variations in zone-specific gains in absence and presence, respectively, of a cross-zone control.
Figure 3B:
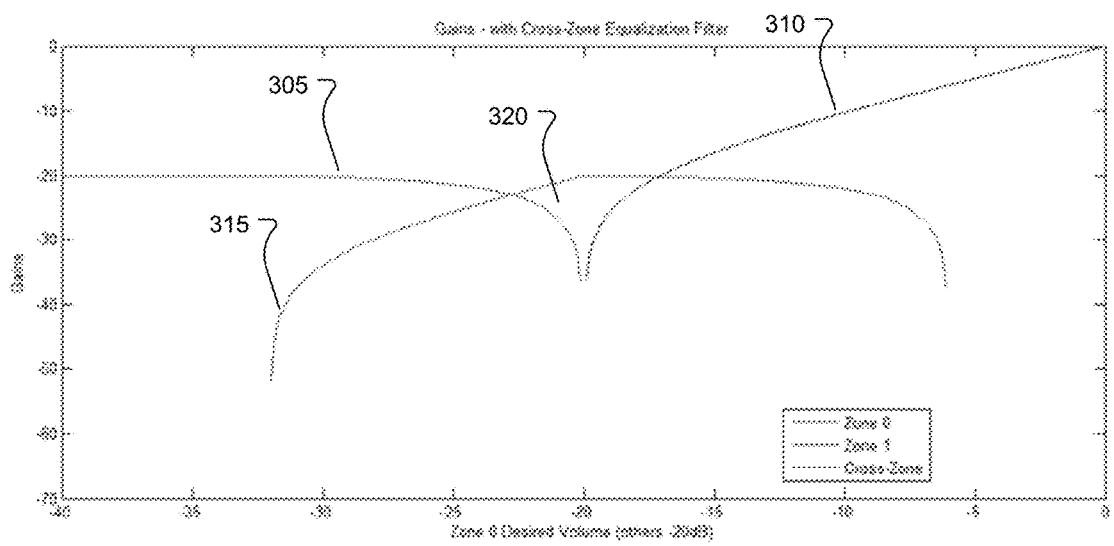

The variations in zone-specific gains in absence and presence, respectively, of a cross-zone control are illustrated in FIGS. 3A and 3B. Specifically, FIG. 3A shows the variation in the gain adjustment signals in the absence of a cross-zone equalization filter, and FIG. 3B shows the variation in the gain adjustment signals in the presence of a cross-zone equalization filter. In FIG. 3A, the desired gain 305 for zone 1 is kept fixed at −20 dB, and the desired gain for 310 for zone 0 is varied from about −30 dB to 0 dB. As illustrated in FIG. 3A, the adjustment engine 225 continues to keep the gain for zone 1 substantially constant until the gain for zone 0 is increased to about −10 dB. If the gain for zone 0 is increased further, the leakage from zone 0 into zone 1 becomes significant, and in an attempt to compensate for the leakage, the gain adjustment engine 225 reduces the gain 305 for zone 1 accordingly.

FIG. 3B illustrates the same input variation as in FIG. 3A, but in the presence of a cross-zone equalization filter. In this case, when the desired volume in both zones are similar to one another (in the vicinity of −20 dB in this example, as depicted by the zone 320), the adjustment engine increases the gain of the cross-zone equalization filter output and attenuates the zone-specific gains. On the other hand, when the desired gains in the two zones deviate from one another, the gain of the cross-zone equalization filter is gradually attenuated.

Figure 4:
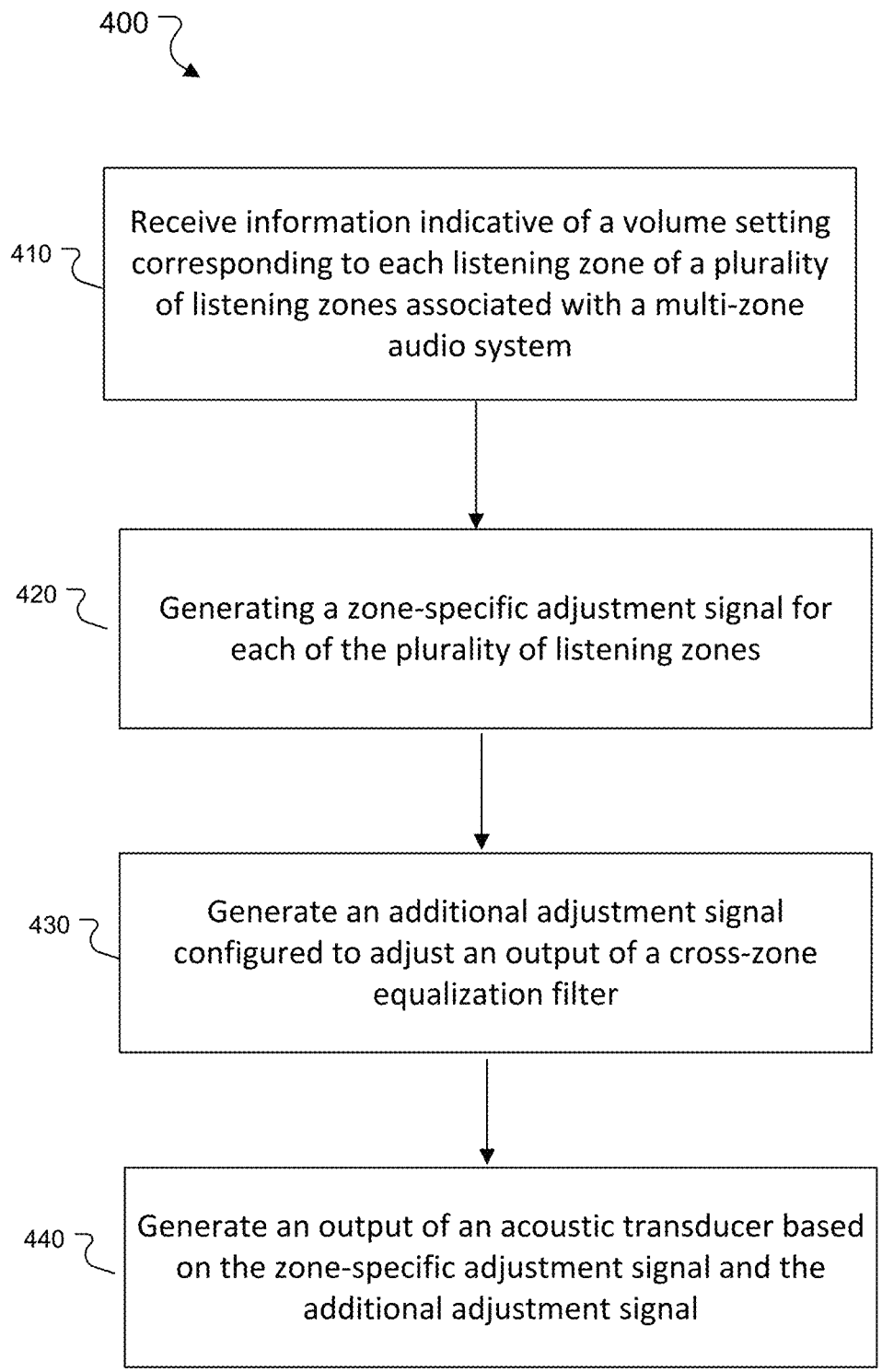
FIG. 4 is a flowchart of an example process for generating zone-specific and cross-zone adjustment signals.

FIG. 4 is a flowchart of an example process 400 for generating zone-specific and cross-zone adjustment signals. In some implementations, at least a portion of the process 400 may be executed by one or more processing devices of the adjustment engine 225 described with reference to FIG. 2. Operations of the process 400 includes receiving information indicative of a volume setting corresponding to each listening zone of a plurality of listening zones associated with a multi-zone audio system (410). In some implementations, the information can be based on manual inputs (e.g., inputs substantially similar to the manual inputs described with reference to FIG. 1A) provided by users of occupants in each of the volume zones. In some implementations, the information can be set to one or more default values in the absence of inputs indicating otherwise. For example, if one of the listening zones have no occupants, the volume setting for that zone can be set to a default value (e.g., zero or the setting corresponding to the driver's value). In some implementations, the information indicative of the volume setting represents a value within a substantially continuous range. In some implementations, the information indicative of the volume setting represents a particular discrete value from a set of discrete values (e.g., a set of selectable discrete values for the volume settings).

Operations of the process 400 also includes generating a zone-specific adjustment signal for each of the plurality of listening zones (410). In some implementations, the zone-specific adjustment signal for a given listening zone accounts for a cross-zone effect associated with a volume setting corresponding to another listening zone. For example, if the user in a first zone increases his volume setting to a level that causes audio to leak into a second zone, the zone-specific adjustment signal for the second zone may be adjusted to reduce the volume in the second zone to account for the leak. In some implementations, the zone-specific adjustment signal is configured to adjust an output of corresponding zone-specific circuitry. For example, a zone-specific adjustment signal can be configured to adjust the gain of a signal output by the corresponding zone-specific circuitry.

In some implementations, a zone-specific circuitry can include a zone-specific equalization filter configured to process an input signal representing audio content for the corresponding listening zone. In some implementations, the zone-specific circuitry can include multiple filters for different frequency bands. For example, a zone-specific circuitry can include a first zone-specific equalization filter configured to process a first input signal in a first frequency range, and at least a second zone-specific equalization filter configured to process a second input signal in a second frequency range that is at least partially non-overlapping with the first frequency range.

In some implementations, generating the zone-specific adjustment signals includes accessing a representation of a look-up table that stores gain values for each of the plurality of listening zones as a function of combinations of volume settings in the plurality of listening zones. For example, if the volume settings for the different zones are selectable discrete values, the zone-specific adjustment signals may be pre-computed for the various combinations, and stored on a storage device accessible to the adjustment engine 225. Upon receiving a combination of volume settings for the different zones, the adjustment engine can be configured to access the storage device and retrieve the corresponding gain adjustment values or parameters to generate the zone-specific adjustment signals.

Operations of the process 400 further includes generating an additional adjustment signal configured to adjust an output of a cross-zone equalization filter (430). The output of the cross-zone equalization filter can be configured to generate a target acoustic distribution across multiple listening zones. For example, the output of the cross-zone equalization filter may drive a set of speakers disposed around the periphery of a vehicle cabin to deliver substantially equal amount of acoustic energy into multiple zones. In some implementations, the filter coefficients of the cross-zone equalization filter are selected in accordance with a target acoustic distribution across the multiple listening zones. The additional adjustment signal may be generated based also on the information indicative of the corresponding volume settings in the different listening zones. In some implementations, the look-up table described above may also store gain values associated with the additional adjustment signal as a function of combinations of volume settings in the plurality of listening zones.

Operations of the process 400 can also include generating an output of an acoustic transducer of the multi-zone audio system based on the zone-specific adjustment signals and the additional adjustment signal (440). This can include, for example, generating a plurality of zone-specific signals by adjusting the outputs of zone-specific circuitry using the corresponding zone-specific adjustment signals and generating a multi-zone signal by adjusting the output of the cross-zone equalization filter using the additional adjustment signal. For example, gains of the outputs of the zone-specific circuitries and the cross-zone equalization filter may be adjusted in accordance with the zone-specific and additional adjustment signals to produce multiple gain-adjusted signals, which are then combined to drive the acoustic transducer.

Though the elements of several views of the drawings herein may be shown and described as discrete elements in a block diagram and may be referred to as "circuitry," unless otherwise indicated, the elements may be implemented as one of, or a combination of, analog circuitry, digital circuitry, or one or more microprocessors executing software instructions. The software instructions may include digital signal processing (DSP) instructions. Unless otherwise indicated, signal lines may be implemented as discrete analog or digital signal lines, as a single discrete digital signal line with appropriate signal processing to process separate streams of audio signals, or as elements of a wireless communication system. Some of the processing operations may be expressed in terms of the calculation and application of coefficients. The equivalent of calculating and applying coefficients can be performed by other analog or digital signal processing techniques and are included within the scope of this patent application. Unless otherwise indicated, audio signals may be encoded in either digital or analog form; conventional digital-to-analog or analog-to-digital converters may not be shown in the figures. For simplicity of wording, "radiating acoustic energy corresponding to the audio signals" in a given channel or from a given array will be referred to as "radiating" the channel from the array.

Although a few implementations have been described in detail above, other modifications are possible. For example, the technology described herein may be extended to an arbitrary number of listening zones that may acoustically interfere with one another. In addition, while the technology has been described primarily with respect to vehicle cabins, it may be applicable in other contexts where audio is delivered to multiple individually controllable listening zones. Speaker configurations other than that shown are possible. For example, the speakers may also be mounted on visors or in a vehicle headliner proximal to seating locations to implement different listening zones. Additional modifications may be made without departing from the scope of the inventive concepts described herein, and, accordingly, other implementations are within the scope of the following claims.

What is claimed is:

1. A method comprising:
   receiving information indicative of a volume setting corresponding to each listening zone of a plurality of listening zones associated with a multi-zone audio system, wherein the volume setting is associated with a target net volume for the corresponding listening zone;
   generating, by one or more processing devices, a zone-specific adjustment signal for each of the plurality of listening zones,
      wherein the zone-specific adjustment signal for a given listening zone accounts for, based on the volume setting corresponding to each of the plurality of listening zones, estimated contributions to the target net volume for the given listening zone of outputs generated in each of the plurality of listening zones, and
      wherein the zone-specific adjustment signal is configured to adjust an output of corresponding zone-specific circuitry;
   generating, by the one or more processing devices, an additional adjustment signal configured to adjust an output of a cross-zone equalization filter, wherein the output of the cross-zone equalization filter is configured to generate a target acoustic distribution across multiple listening zones, and wherein each of (i) the zone-specific adjustment signals and (ii) the additional adjustment signal is configured to adjust corresponding audio signals from a same audio source; and
   generating an output of an acoustic transducer of the multi-zone audio system based on the zone-specific adjustment signals and the additional adjustment signal, the output of the acoustic transducer being substantially in accordance with the target net volume for the corresponding listening zone.

2. The method of claim 1, wherein each of the zone-specific circuitry comprises a zone-specific equalization filter configured to process an input signal representing audio content for the corresponding listening zone.

3. The method of claim 1, wherein each of the zone-specific circuitry comprises a first zone-specific equalization filter configured to process a first input signal in a first frequency range, and at least a second zone-specific equalization filter configured to process a second input signal in a second frequency range that is at least partially non-overlapping with the first frequency range.

4. The method of claim 1, wherein filter coefficients of the cross-zone equalization filter are selected in accordance with a target acoustic distribution across the multiple listening zones.

5. The method of claim 1, wherein the target net volume for each of the plurality of listening zones is a gain computed based on the information indicative of the corresponding volume settings.

6. The method of claim 5, further comprising generating the additional adjustment signal based also on the information indicative of the corresponding volume settings.

7. The method of claim 1, further comprising generating the additional adjustment signal based also on the information indicative of the corresponding volume settings.

8. The method of claim 1, wherein generating the zone-specific adjustment signals comprises accessing a representation of a look-up table that stores gain values for each of the plurality of listening zones as a function of combinations of volume settings in the plurality of listening zones.

9. The method of claim 8, wherein the look-up table also stores gain values associated with the additional adjustment signal as a function of combinations of volume settings in the plurality of listening zones.

10. The method of claim 1, wherein the plurality of listening zones are located within a vehicle.

11. The method of claim 1, wherein generating the output of the acoustic transducer comprises:
   generating a plurality of zone-specific signals by adjusting the outputs of zone-specific circuitry using the corresponding zone-specific adjustment signals;
   generating a multi-zone signal by adjusting the output of the cross-zone equalization filter using the additional adjustment signal; and
   combining the plurality of zone-specific signals and the multi-zone signal to drive the acoustic transducer.

12. The method of claim 1, wherein the information indicative of the volume setting represents a value within a substantially continuous range.

13. The method of claim 1, wherein the information indicative of the volume setting represents a particular discrete value from a set of discrete values.

14. An audio system configured to deliver audio to a plurality of listening zones, the system comprising:
   multiple acoustic transducers disposed in the plurality of listening zones;
   zone-specific circuitry corresponding to one or more of the plurality of listening zones;

a cross-zone equalization filter configured to control one or more of the acoustic transducers to generate a target acoustic distribution across multiple listening zones; and an adjustment engine comprising one or more processing devices, the adjustment engine configured to:
receive information indicative of a volume setting corresponding to each listening zone of the plurality of listening zones, wherein the volume setting is associated with a target net volume for the corresponding listening zone,
generate a zone-specific adjustment signal for each of the plurality of listening zones, wherein the zone-specific adjustment signal for a given listening zone accounts for, based on the volume setting corresponding to each of the plurality of listening zones, estimated contributions to the target net volume for the given listening zone of outputs generated in each of the plurality of listening zones, and is configured to adjust an output of the corresponding zone-specific circuitry,
generate an additional adjustment signal configured to adjust an output of the cross-zone equalization filter, wherein each of (i) the zone-specific adjustment signals and (ii) the additional adjustment signal is configured to adjust corresponding audio signals from a same audio source, and
wherein the zone-specific adjustment signals and the additional adjustment signal are combined to generate an output from at least one of the multiple acoustic transducers, the output from the at least one of the multiple acoustic transducers being substantially in accordance with the target net volume for the corresponding listening zone.

15. The system of claim 14, wherein each of the zone-specific circuitry comprises a zone-specific equalization filter configured to process an input signal representing audio content for the corresponding listening zone.

16. The system of claim 14, wherein each of the zone-specific circuitry comprises a first zone-specific equalization filter configured to process a first input signal in a first frequency range, and at least a second zone-specific equalization filter configured to process a second input signal in a second frequency range that is at least partially non-overlapping with the first frequency range.

17. The system of claim 14, wherein filter coefficients of the cross-zone equalization filter are selected in accordance with a target acoustic distribution across the multiple listening zones.

18. The system of claim 14, wherein the target net volume for each of the plurality of listening zones is a gain computed based on the information indicative of the corresponding volume settings.

19. The system of claim 14, wherein the adjustment engine is configured to generate the additional adjustment signal based also on the information indicative of the corresponding volume settings.

20. The system of claim 14, wherein the adjustment engine is configured to generate the zone-specific adjustment signals by accessing a representation of a look-up table that stores gain values for each of the plurality of listening zones as a function of combinations of volume settings in the plurality of listening zones.

21. The system of claim 20, wherein the look-up table also stores gain values associated with the additional adjustment signal as a function of combinations of volume settings in the plurality of listening zones.

22. The system of claim 14, wherein generating the output of the at least one of the multiple acoustic transducers comprises:
generating a plurality of zone-specific signals by adjusting the outputs of zone-specific circuitry using the corresponding zone-specific adjustment signals;
generating a multi-zone signal by adjusting the output of the cross-zone equalization filter using the additional adjustment signal; and
combining the plurality of zone-specific signals and the multi-zone signal to drive the at least one of the multiple acoustic transducers.

23. The system of claim 14, wherein the information indicative of the volume setting represents a value within a substantially continuous range.

24. The system of claim 14, wherein the information indicative of the volume setting represents a particular discrete value from a set of discrete values.

25. One or more non-transitory machine-readable storage devices having encoded thereon computer readable instructions for causing one or more processing devices to perform operations comprising:
receiving information indicative of a volume setting corresponding to each listening zone of a plurality of listening zones associated with a multi-zone audio system, wherein the volume setting is associated with a target net volume for the corresponding listening zone;
generating a zone-specific adjustment signal for each of the plurality of listening zones,
wherein the zone-specific adjustment signal for a given listening zone accounts for, based on the volume setting corresponding to each of the plurality of listening zones, estimated contributions to the target net volume for the given listening zone of outputs generated in each of the plurality of listening zones, and
wherein the zone-specific adjustment signal is configured to adjust an output of corresponding zone-specific circuitry;
generating an additional adjustment signal configured to adjust an output of a cross-zone equalization filter, wherein the output of the cross-zone equalization filter is configured to generate a target acoustic distribution across multiple listening zones, and wherein each of (i) the zone-specific adjustment signals and (ii) the additional adjustment signal is configured to adjust corresponding audio signals from a same audio source; and
causing generation of an output of an acoustic transducer of the multi-zone audio system based on the zone-specific adjustment signals and the additional adjustment signal, the output of the acoustic transducer being substantially in accordance with the target net volume for the corresponding listening zone.

* * * * *